(12) United States Patent
Nagamori et al.

(10) Patent No.: US 7,053,708 B2
(45) Date of Patent: May 30, 2006

(54) ELECTRONIC COMPONENT FOR HIGH FREQUENCY POWER AMPLIFIER AND RADIO COMMUNICATION SYSTEM

(75) Inventors: Hiroyuki Nagamori, Komoro (JP); Yasuhiro Nunogawa, Takasaki (JP); Takayuki Tsutsui, Saku (JP)

(73) Assignee: Renesas Technology Corp., Tokyo (JP)

( * ) Notice: Subject to any disclaimer, the term of this patent is extended or adjusted under 35 U.S.C. 154(b) by 69 days.

(21) Appl. No.: 10/820,026

(22) Filed: Apr. 8, 2004

(65) Prior Publication Data

US 2004/0212434 A1    Oct. 28, 2004

(30) Foreign Application Priority Data

Apr. 28, 2003 (JP) .............................. 2003-123040

(51) Int. Cl.
*H03G 5/16* (2006.01)
(52) U.S. Cl. ...................................... 330/133; 330/127
(58) Field of Classification Search ................ 330/296, 330/140, 302, 310, 133, 127
See application file for complete search history.

(56) References Cited

U.S. PATENT DOCUMENTS

| | | | | |
|---|---|---|---|---|
| 4,962,484 | A * | 10/1990 | Takeshima et al. | 365/185.04 |
| 5,982,236 | A * | 11/1999 | Ishikawa et al. | 330/296 |
| 6,480,700 | B1 * | 11/2002 | Groe et al. | 455/69 |
| 6,897,728 | B1 * | 5/2005 | Numanami et al. | 330/277 |
| 6,919,762 | B1 * | 7/2005 | Akamine et al. | 330/133 |
| 2002/0137481 | A1 * | 9/2002 | Chen et al. | 455/127 |

FOREIGN PATENT DOCUMENTS

JP    2000-151310    8/1999

OTHER PUBLICATIONS

"Basics and Applications of Microwave Circuits", published by Sogo Denshi Publishing, Section entitled Cross Guide Directional Coupler, Jul. 1997. pp. 191-193, with English translation.

Toshihiko Kouno, "Electronic Components that Support More Compact and More Portable Sets", Electronic Materials, Apr. 1999, published by Kogyochosakai Publishing Co., Ltd., pp. 91-95, with English translation.

* cited by examiner

*Primary Examiner*—Dinh T. Le
(74) *Attorney, Agent, or Firm*—Reed Smith LLP; Stanley P. Fisher, Esq.; Juan Carlos A. Marquez, Esq.

(57) ABSTRACT

There are provided an electronic component for high frequency power amplification provided with a high-sensitivity output power detection circuit which is immune to the influence of changes in the use environment thereof, free of an output mismatch, small in size, and low in insertion loss and a wireless communication system using the electronic component. There are provided an output detection transistor which receives, at a control terminal, a voltage extracted from the intermediate node of an impedance matching circuit provided between the final-stage power amplification transistor of a high-frequency power amplification circuit and an output terminal thereof via a capacitor element and allows a current proportional to an output power to flow, a bias generation circuit for giving an operating point to the control terminal of the transistor, a current mirror circuit for transferring the current flowing in the output detection transistor, and a current-to-voltage conversion transistor for converting the transferred current to a voltage.

12 Claims, 8 Drawing Sheets

OUTPUT MATCHING CIRCUIT

ELECTRONIC COMPONENT FOR HIGH FREQUENCY POWER AMPLIFIER AND RADIO COMMUNICATION SYSTEM

CROSS-REFERENCE TO RELATED APPLICATION

The present application claims priority from Japanese patent application JP 2003-123040 filed on Apr. 28, 2003, the content of which is hereby incorporated by reference into this application.

BACKGROUND OF THE INVENTION

The present invention relates to a technology which is effective when applied to an electronic component having an embedded high frequency power amplification circuit used in a wireless communication system such as a mobile phone to amplify a high frequency signal to be transmitted and output the amplified signal. More particularly, the present invention relates to a technology which is effective when used to detect an output power necessary for the feedback control of the output power.

In general, a transmitter output portion of a wireless communication apparatus (mobile communication apparatus) such as a mobile phone is provided with a high frequency power amplification circuit for amplifying a modulated signal to be transmitted. Since a conventional wireless communication apparatus controls the amplification factor of a high frequency power amplification circuit in accordance with a transmission level requested from a baseband circuit or a control circuit such as a microprocessor, it has been conventional practice to detect an output power of a high frequency power amplification circuit or an antenna and feedback it (see, e.g., Patent Document 1). Conventionally, the detection of the output power has been performed typically by using a coupler, a detection circuit, or the like and the detection circuit is constructed in most cases as a semiconductor integrated circuit distinct from the high frequency power amplification circuit.

A coupler is an element for detecting an output power via a capacitor formed between a discrete component or an output line (microstrip line) formed in an insulating substrate (module substrate) and a conductor disposed in parallel therewith, which is larger in size than the elements formed on a semiconductor chip. As for a directional coupler, it is described at, e.g., pages 191–193 of "Basics and applications of microwave circuits," published by Sogo Denshi Publishing in Jul. 10, 1997. There is also a description on a ceramic multilayer lowpass filter for mobile communication and a directional coupler at pages 91–95 of the April 1999 issue of Electronic Materials, published by Kogyochosakai Publishing Co., Ltd.

[Patent Document 1] Japanese Unexamined Patent Publication No. 2000-151310

SUMMARY OF THE INVENTION

In an output power detection mode for a conventional high frequency power amplification circuit using a coupler, not only the large-sized coupler but also a diode for detecting the output are necessary and numerous other semiconductor integrated circuits and electronic components are used additionally to the high frequency power amplification circuit so that it has been difficult to scale down the module. In the case of using a coupler, a reference voltage may be applied occasionally to one end of the coupler to improve detection sensitivity. In that case, it becomes necessary to adjust a voltage and the like in accordance with the optimum setting of the reference voltage and component variations so that a load on a set maker is increased disadvantageously. In addition, the use of the coupler also causes the problem of power loss.

In recent years, a mobile phone in a dual-band mode has been proposed which can handle signals not only in a mode termed GSM (Global System for Mobile Communication) using frequencies in the band of 880 to 915 MHz but also in a mode using frequencies in the band of 1710 to 1785 MHz, such as DCS (Digital Cellular System). Since a high frequency power amplifier module used in such a mobile phone is provided with output power amplifiers corresponding to the individual bands, couplers for detecting output powers therefrom are also necessary in correspondence with the individual bands. This makes it more difficult to scale down the module.

In view of the foregoing, the present applicant examined an output power detection mode for a high frequency power amplification circuit which does not use a coupler. Of the characteristics required of the output power detection circuit for a high frequency power amplification circuit in a wireless communication system, the following five are particularly important, which are: (1) small size; (2) high sensitivity; (3) low insertion loss; (4) immunity to the influence of changes in the use environment thereof, such as power source voltage changes and temperature changes; and (5) the ability to prevent an abnormal current from flowing in the power amplification circuit due to a mismatch between the output state of an actual power amplification circuit and the feedback control of the output and prevent the resulting breakdown of the power amplification circuit.

Although the conventional detection mode using the coupler substantially satisfies the characteristic requirements (2), (4), and (5), it does not fully satisfy the requirements (1) and (3) of small size and low insertion loss.

An object of the present invention is to provide a technology for detecting an output power which accomplishes reductions in the size and insertion loss of a detection circuit in a wireless communication system which detects the output power and performing feedback control thereof.

Another object of the present invention is to provide an electronic component for high frequency power amplification provided with a high-sensitivity output power detection circuit which is immune to the influence of changes in the use environment thereof, free of an output mismatch, small in size, and low in insertion loss and a wireless communication system using the electronic component.

The above and other objects and novel features of the present invention will become apparent from the description of the present specification and the accompanying drawings.

The following is a brief description given to the outline of the representative aspects of the present invention disclosed in the present application.

Specifically, in accordance with a first aspect of the present invention, there are provided an output detector transistor which receives, at the control terminal thereof, a voltage extracted from an intermediate node of an impedance matching circuit provided between the final-stage power amplification transistor of a high frequency power amplification circuit and the output terminal thereof via a resistor and a capacitor element and allows a current proportional to an output power to flow, a bias generation circuit for giving an operating point to the control terminal of the transistor, a current mirror circuit for transferring the current flowing in the foregoing output detector transistor, and a current-to-voltage conversion circuit for converting the transferred current to the voltage.

Preferably, the foregoing bias generation circuit is constructed to give a bias voltage which causes the transistor to perform a class-B amplifying operation. There is also provided a subtraction circuit for calculating a difference between the detected voltage converted by the foregoing current-to-voltage conversion circuit and the bias voltage given by the foregoing bias circuit. In addition, a π-type matching circuit composed of a microstrip line formed on a module substrate and two capacitor elements connected to the line is used as the impedance matching circuit. The node of the impedance matching circuit connected to the resistor and capacitor element for monitoring the output power is positioned at a midpoint in the microstrip line between the two capacitor elements.

The foregoing means allows the output power to be monitored by using the capacitor elements without using a coupler and also allows the bias generation circuit, the current mirror circuit, and the current-to-voltage conversion circuit each constituting the detection circuit to be formed on a single semiconductor chip as a semiconductor integrated circuit, so that the detection circuit is reduced in size. In the case where a voltage for monitoring the output power of the high frequency power amplification circuit is extracted from the impedance matching circuit, the voltage extraction can be performed by using only the capacitor elements since it is sufficient to derive an ac component. However, the provision of a resistor element between the capacitor element and the connection node of the impedance matching circuit makes the capacitor located ahead of the resistor less visible from the final-stage power amplification transistor and thereby achieves a reduction in insertion loss.

Because the current mirror circuit for transferring the detected current is provided, a detected output in which the influence of variations in the characteristics (particularly the threshold voltage) of the detector transistor has been cancelled can be obtained. By providing the subtraction circuit for calculating the difference between the detected voltage converted by the current-to-voltage conversion circuit and the bias voltage for the detector transistor, a signal resulting from the subtraction of a dc component from the detected signal by the subtraction circuit is obtainable so that the detection circuit which allows high-sensitivity detection of the output power is implemented.

In accordance with a second aspect of the present invention, the detection of an output power necessary for the feedback control of the output power is performed by providing a transistor which receives, at the control terminal thereof, the same input signal to the final-stage power amplification transistor and allows a current obtained by proportionally reducing the input signal to flow, a current mirror circuit for transferring the current flowing in the transistor, a current-to-voltage conversion circuit for converting the transferred current to a voltage, a lowpass filter for deriving the dc component of the input signal therefrom, and a subtraction circuit for calculating a difference between a voltage converted by the current-to-voltage conversion circuit and the dc component of the input signal derived by the lowpass filter.

The foregoing means is free of an insertion loss because an output power detection circuit is not provided between the final-stage power amplification transistor and an antenna terminal and allows a signal resulting from the subtraction of a dc component from a signal detected in a current detection mode based on the same input signal to the final-stage power amplification transistor and containing an ac component and the dc component to be obtained from the subtraction circuit so that the detection circuit which allows high-sensitivity detection of the output power is implemented.

DETAILED DESCRIPTION OF THE PREFERRED EMBODIMENTS

Referring to the drawings, the preferred embodiments of the present invention will be described herein below.

Figure 1:
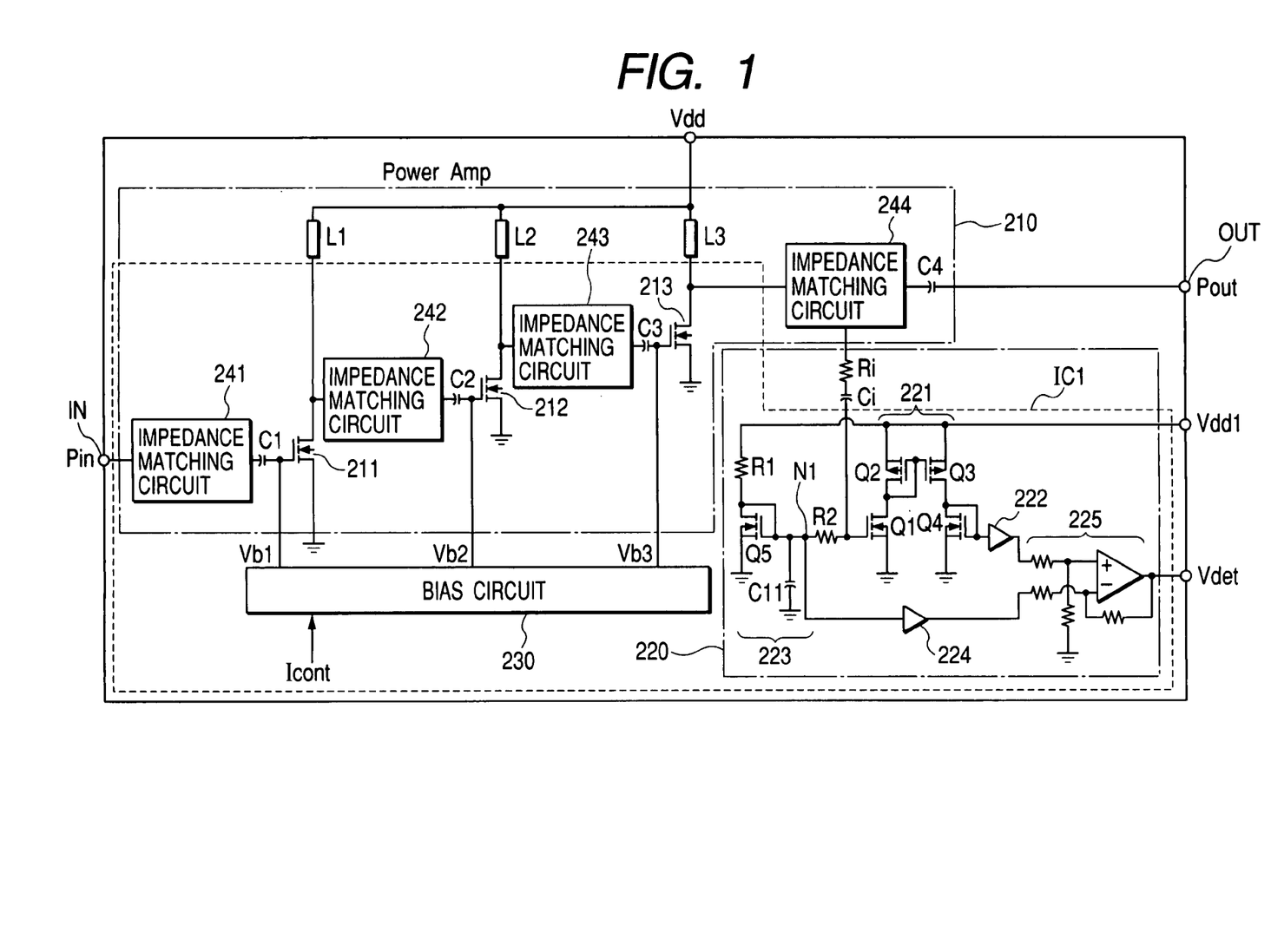
FIG. 1 is a circuit structural view showing an embodiment of a high frequency power amplifier (power module) using an output power detection circuit in a first detection mode in a wireless communication system to which the present invention is applied.

FIG. 1 shows an embodiment of a high frequency power amplifier (hereinafter referred to as a power module) to which an output power detection circuit in a first detection mode according to the present invention is applied. In the present specification, a plurality of semiconductor chips and discrete components which are mounted on an insulating substrate, such as a ceramic substrate with printed wiring provided on the surface or in the inside thereof, and which can be handled as if they compose a single electronic component with the individual components being combined by the printed wiring and bonding wires to perform a specified function will be termed a module.

The power module 200 according to the present embodiment comprises: a high frequency power amplifier portion 210 including power amplifier FETs each for amplifying an input high frequency signal Pin; an output power detection circuit 220 for detecting an output power of the high frequency power amplification circuit 210; and a bias circuit 230 for giving a bias voltage to each of the power amplifier FETs in the individual stages of the high frequency power amplifier 210 and thereby controlling an idle current allowed to flow in each of the FETs.

In the present embodiment, the high frequency power amplifier portion 210 has three power amplifier FETs 211, 212, and 213, though they are not particularly limited. Of the power amplifier FETs 211, 212, and 213, the FETs 212 and 213 in the stages subsequent to the FETs 211 and 212 have gate terminals connected to the respective drain terminals of the FETs 211 and 212 in the preceding stages such that the whole high frequency power amplifier portion 210 is formed as a 3-stage amplification circuit. Gate bias voltages Vb1, Vb2, and Vb3 supplied from the bias circuit 230 are applied to the respective gate terminals of the individual FETs so that idle currents in accordance with these voltages are allowed to flow in the individual FETs 211, 212, 213.

Although MOSFETs are used as the power amplifier elements 211 to 213, it is also possible to use other transistors such as bipolar transistors, GaAs MESFETs, a heterojunction bipolar transistor (HBTs), or HEMTs (High Electron Mobility Transistors).

A power source voltage Vdd is applied to the respective drain terminals of the individual FETs 211, 212, and 213 via respective inductance elements L1, L2, and L3. An impedance matching circuit 241 and a dc cut capacitor element C1 are provided between the gate terminal of the first-stage FET 211 and an input terminal In so that a high frequency signal Pin is inputted to the gate terminal of the FET 211 via the circuit and element.

An impedance matching circuit 242 and a dc cut capacitor element C2 are connected between the drain terminal of the first-stage FET 211 and the gate terminal of the second-stage FET 212. An impedance matching circuit 243 and a dc cut capacitor element C3 are connected between the drain terminal of the second-stage FET 212 and the final-stage FET 213. The drain terminal of the final-stage FET 213 is connected to an output terminal OUT via the impedance matching circuit 244 and a capacitor element C4 so that a signal Pout obtained by cutting the dc component of the high frequency input signal Pin therefrom and amplifying the ac component thereof is outputted.

In this embodiment, the output power detection circuit 220 comprises: a resistor Ri having one terminal connected to the internal node of the impedance matching circuit 244 provided between the drain terminal of the final-stage power amplifier FET 213 and the output terminal OUT of the module; a capacitor Ci connected in series to the resistor; an N-channel MOS transistor Q1 having a gate connected to the other terminal of the capacitor Ci; a P-channel MOS transistor Q2 connected in series to the transistor Q1; a MOS transistor Q3 current mirror connected to the transistor Q2; a current-to-voltage conversion MOS transistor Q4 connected in series to the transistor Q3; a buffer circuit 222 for performing impedance conversion with respect to a converted voltage and supplying it to the subsequent stage; a bias generation circuit 223 for giving a gate bias voltage to the MOS transistor Q1; a buffer circuit 224 for performing impedance conversion with respect to a bias voltage generated from the bias generation circuit 223 and supplying it to the subsequent stage; and a subtraction circuit 225 for outputting a voltage obtained by subtracting an output of the buffer circuit 224 from an output of the buffer circuit 222. A voltage follower can be used for each of the buffer circuits 222 and 224.

A preferred resistance value of the resistor Ri is about 30 to 3 k$\Omega$, while a preferred capacitance value of the capacitor Ci is about 2 to 100 pF.

The bias generation circuit 223 is comprised of: a resistor R1 and a MOS transistor Q5 connected in series between a power source terminal Vdd1 and a grounding point; a resistor R2 connected between the gate terminal of the MOS transistor Q5 and the gate terminal of the MOS transistor Q1 output detection; and a capacitor C11 connected between the gate terminal of the MOS transistor Q5 and the grounding point. The MOS transistor Q5 is so constructed as to operate as a diode with the gate terminal and drain terminal thereof being coupled to each other. The MOS transistor Q5 gives, as a bias voltage, a voltage obtained by dividing the power source voltage Vdd1 by a ratio between the resistance of the resistor R1 and the ON-resistance of the transistor Q5 to the gate terminal of the MOS transistor Q1 for output detection.

In the present embodiment, a voltage value close to the threshold voltage of the MOS transistor Q1 for output detection is set as the value of the bias voltage to enable the MOS transistor Q1 to perform a class-B amplifying operation. As a result, a current proportional to the waveform of an ac signal inputted via the capacitor Ci, which is obtainable by half-wave rectifying the ac signal, is allowed to flow in the MOS transistor Q1 so that a drain current in the transistor Q1 contains a dc current proportional to the amplitude of the input ac signal.

The drain current Id in the transistor Q1 is transferred by the current mirror circuit 221 composed of the transistors Q2 and Q3 onto the transistor Q3 and converted to a voltage by the transistor Q4. The MOS transistors Q1 and Q4 as well as the MOS transistors Q2 and Q3 have been designed to have predetermined size ratios therebetween. Accordingly, if the characteristics (particularly the threshold voltages) of the MOS transistors Q1 and Q2 vary due to fabrication variations, e.g., the characteristics of the MOS transistors Q4 and Q3 forming pairs therewith also vary.

As a result, the influence of the characteristic variations is compensated for and an output detected voltage immune to the influence of the variations among the MOS transistors appears at the drain terminal of the MOS transistor Q4. If the characteristics of the MOS transistors Q1 and Q2 change in response to a temperature change, the characteristics of the MOS transistors Q3 and Q4 forming pairs therewith also change. As a result, the influence of the characteristic changes is compensated for and an output detected voltage immune to the influence of the temperature change appears at the drain terminal of the MOS transistor Q4.

In the present embodiment, a potential Vn11 at a connection node N1 between the gate terminal of the MOS transistor Q5 of the bias generation circuit 223 and the resistor R2 is inputted to the input terminal of the buffer circuit 224. The resistor R2 and the capacitor C11 prevent the ac component of the output power fetched via the capacitor Ci from encroaching into the input of the buffer 224. The same voltage as the bias voltage generated by the bias generation circuit 223 and applied to the gate terminal of the MOS transistor Q1 for output detection is supplied to the subtraction circuit 225 via the buffer circuit 224 and a voltage obtained by subtracting the bias voltage from the output detected voltage is outputted from the subtraction circuit 225. Accordingly, the output of the subtraction circuit 225 becomes a detected voltage Vdet proportional to the ac component of a genuine output power not containing the dc component which is given by the bias generation circuit 223. In addition, the output of the subtraction circuit 225 becomes a voltage immune to the influence of a temperature change even when a gate bias voltage in the transistor Q1 changes in response to the temperature change.

A preferred resistance value of the resistor R2 is about 10 to 30 kΩ, while a preferred capacitance value of the capacitor C11 is about 10 to 50 pF.

In the power module 200 according to the present embodiment, the portion enclosed by the broken lines has been formed into a semiconductor integrated circuit. That is, the individual elements of the power amplifier portion 210 (except for the inductance elements L1 to L3 and the impedance matching circuit 244), the individual elements of the bias circuit 230, and the individual elements of the output power detection circuit 220 (except for the resistor Ri and the capacitor i) are formed as a semiconductor integrated circuit on a single semiconductor chip made of, e.g., single-crystal silicon. The semiconductor chip IC1, the inductance elements L1 to L3 and impedance matching circuit 244 of the power amplifier portion 210, and the resistor Ri and capacitor Ci of the output power detection circuit 220 are mounted on a single ceramic substrate to constitute a power module.

Since a coupler is not used in the power module to which the output power detection mode according to the present embodiment is applied, the module can thus be reduced in size and the output power detection circuit 220 can easily be formed into a semiconductor integrated circuit in conjunction with the principle portion of the power amplifier portion 210 including the bias circuit 230 thereof. This allows a reduction in the number of components and a reduction in the size of the module.

Figure 2:
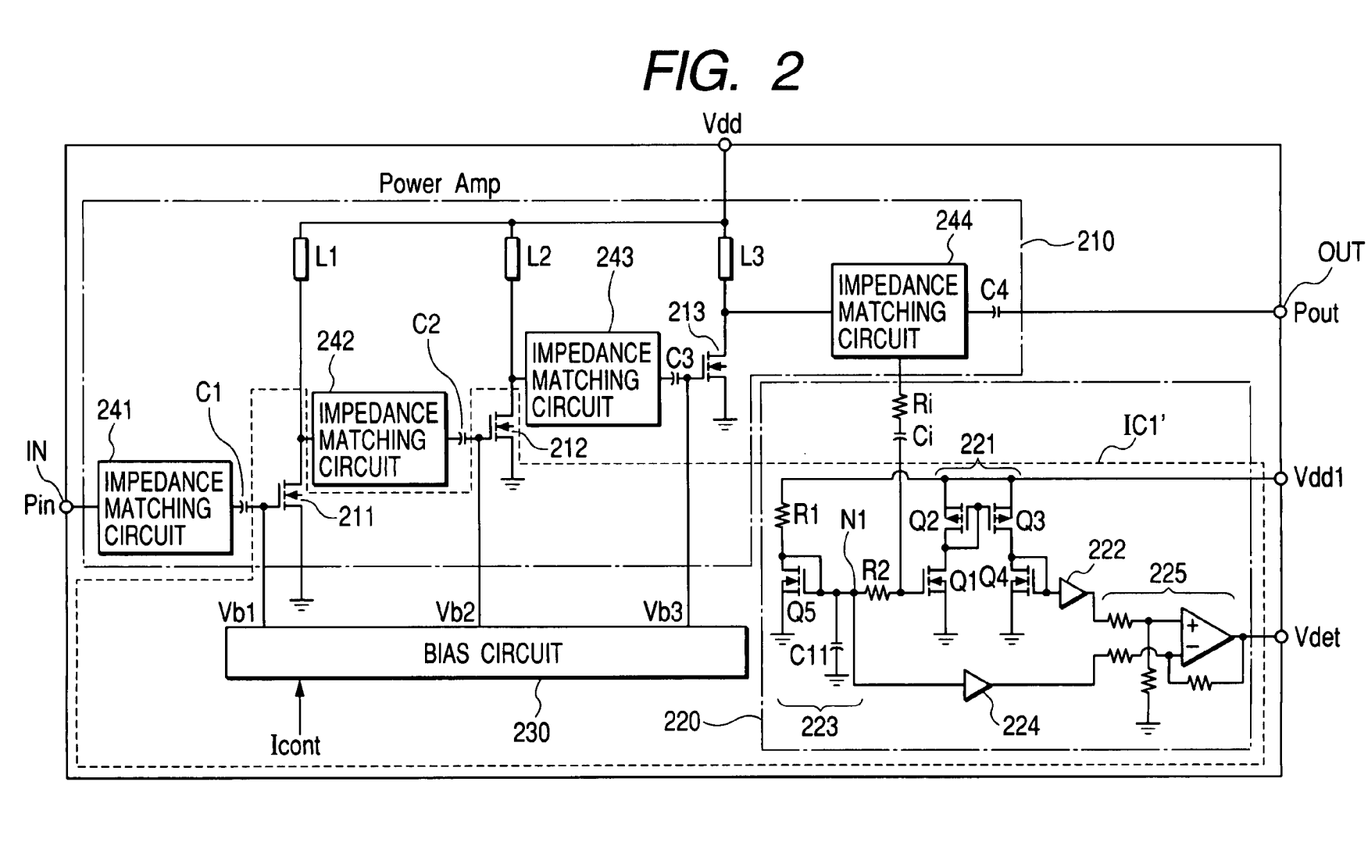
FIG. 2 is a circuit structural view showing a variation of the power module according to the embodiment.

FIG. 2 shows a variation of the embodiment shown in FIG. 1. The variation is different from the embodiment shown in FIG. 1 in the construction of a semiconductor integrated circuit. Specifically, the first-stage FET 211, the second-stage FET 212, the bias circuit 230, and the output power detection circuit 220 have been formed into a single semiconductor integrated circuit IC1'. In other words, the FET 213 in the final stage of the power amplifier portion 210, the impedance matching circuits 241 to 244 thereof, and the inductance elements L1 to L3 thereof are provided externally of the IC. Although the variation is slightly inferior to the embodiment of FIG. 1 in terms of the mounting density of the module, it has an advantage over the embodiment of FIG. 1 that circuit performance can be enhanced since parts having more excellent characteristics than the on-chip parts can be used for the impedance matching circuits 241 to 243 and the final-stage FET 213.

A description will be given next to an optimal point at which the output power detection circuit 220 monitors the output power in the power module according to the embodiment of FIGS. 1 and 2 with reference to FIGS. 3 to 6. In the power module according to the present embodiment, as shown in FIG. 1, the output power from the impedance matching circuit 244 to the output power detection circuit 220 is extracted by connecting the resistor Ri and the capacitor Ci of the output power detection circuit 220 to the impedance matching circuit 244.

Figure 3:
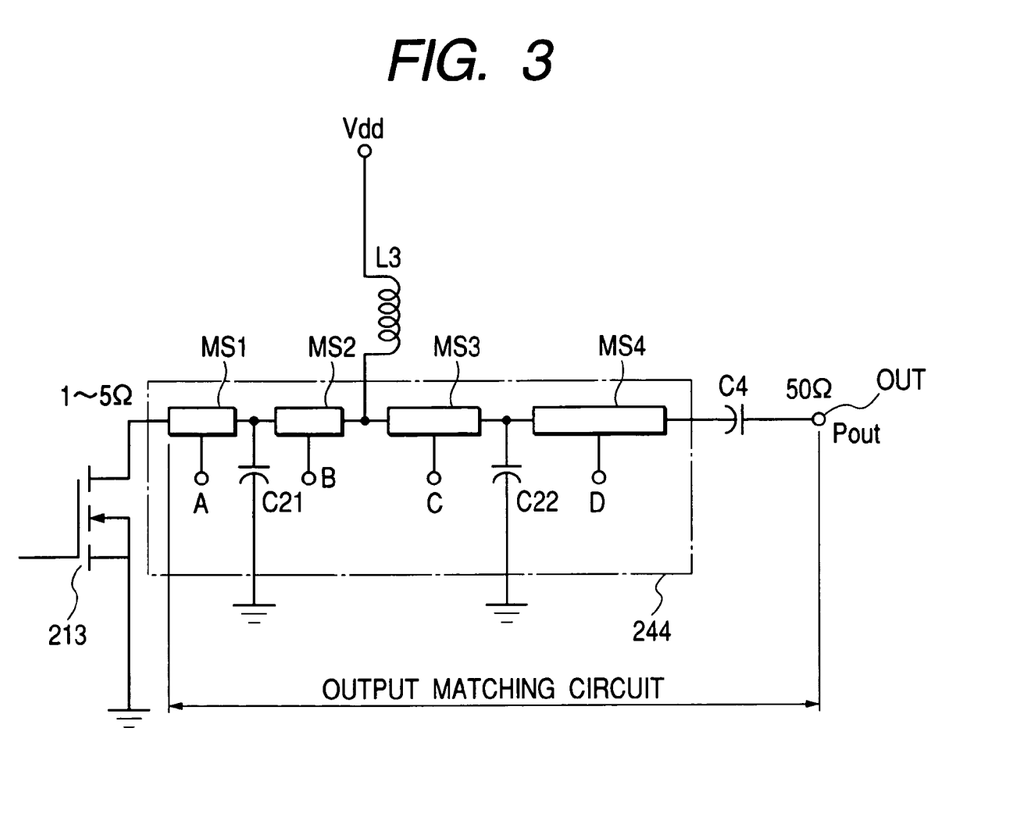
FIG. 3 is a circuit diagram of an impedance matching circuit showing an example of a method for extracting an output power from the matching circuit to the output power detection circuit.

If the impedance matching circuit 244 is represented by an equivalent circuit, a so-called π-type matching circuit as shown in FIG. 3 is obtained, which comprises: microstrip lines MS1 to MS4 connected in series to a dc cut capacitor C4 between the drain terminal of the final-stage power amplifier FET 213 and the output terminal OUT of the module; a capacitor C21 connected between a grounding point and a connection node between the microstrip lines MS1 and MS2; and a capacitor C22 connected between the grounding point and a connection node between the microstrip lines MS3 and MS4. Accordingly, the extraction of the output power from the impedance matching circuit 244 assumes four cases depending on from which one of the microstrip lines MS1 to MS4 the output power is extracted, as indicated by the signs A, B, C, and D in FIG. 3.

The present inventors have examined from which one of these four points it is desirable to extract the output power. Although FIG. 3 shows the four microstrip lines MS1 to MS4 included in the matching circuit 244, there are cases where the microstrip lines are formed of an indiscrete conductor layer in an actual module. If the microstrip lines are represented by using a lumped-constant element, they can be considered as a continuum of inductance elements in a series configuration and capacitor elements connected between the grounding points and connection nodes between the individual inductance elements.

The matching circuit 244 is designed to have an impedance of 50Ω at the output terminal OUT as the terminating end relative to an impedance of 1 to 5Ω at the drain terminal of the final-stage power amplifier FET 213 as the leading end. In the impedance matching circuit 244, if a load on an antenna connected to the output terminal OUT of the impedance matching circuit 244 via a lowpass filter or the like fluctuates, the phase of a wave reflected by the antenna terminal and returned to the microstrip lines MS1 to MS4 changes disadvantageously. When the phase of the reflected wave changes, powers at the individual points of the impedance matching circuit 244 composed of the microstrip lines also change. Since the power changes caused by the changes in the phase of the reflected wave differ at the individual points of the impedance matching circuit 244 composed of the microstrip lines, it can be considered that the magnitude of the voltage Vdet detected by the output power detection circuit 220 also differs at the individual points.

Figure 4:
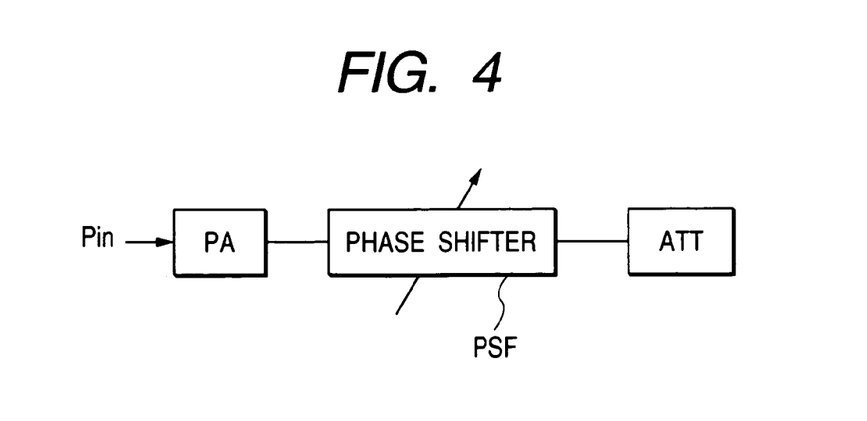
FIG. 4 is a circuit diagram showing an example of a circuit for simulation, which is for examining the difference between output power extraction methods in the embodiment.

In view of the foregoing, the present inventors tentatively simulated the calculation of the respective magnitudes of the voltages Vdet detected by the output power detection circuit 220 at the individual points A to D in the impedance matching circuit 244 shown in FIG. 3 when the phase of the reflected wave was changed. To examine the influence of a load fluctuation, the foregoing simulation of the magnitudes of the detected voltages Vdet was performed by connecting a 3-dB attenuator ATT in place of the antenna, setting VSWM (voltage standing wave ratio S) at the output terminal to 9:1, and providing a phase shifter PSF between the power amplification circuit PA and the attenuator ATT to rotate the phase of the reflected wave, as shown in FIG. 4. If the voltage of a traveling wave is denoted by VF, the voltage of the reflected wave is denoted by VR, and a reflection coefficient is denoted by Γ, Γ=VR/VF and S=(1+ |Γ|)/(1−|Γ|) are satisfied.

Figure 5A:
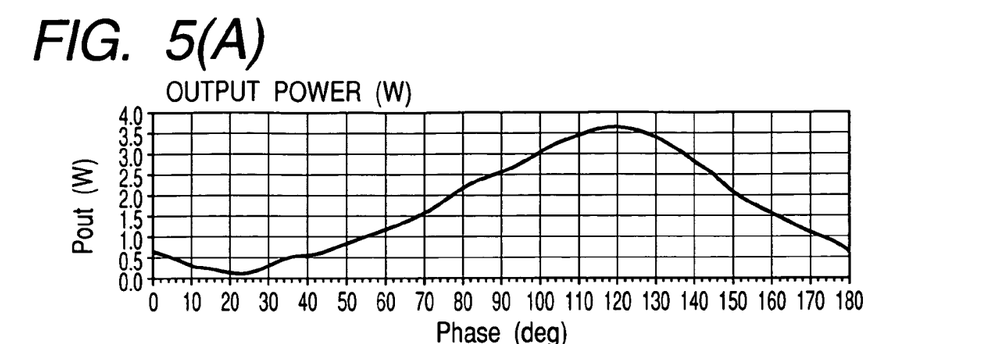
FIGS. 5A, 5B, 5C and 5D are graphs each showing the output power Pout and a detected voltage Vdet which vary with the phase of a reflected wave when a port for extracting a monitor voltage to the output power detection circuit is changed in the impedance matching circuit.
Figure 5B:
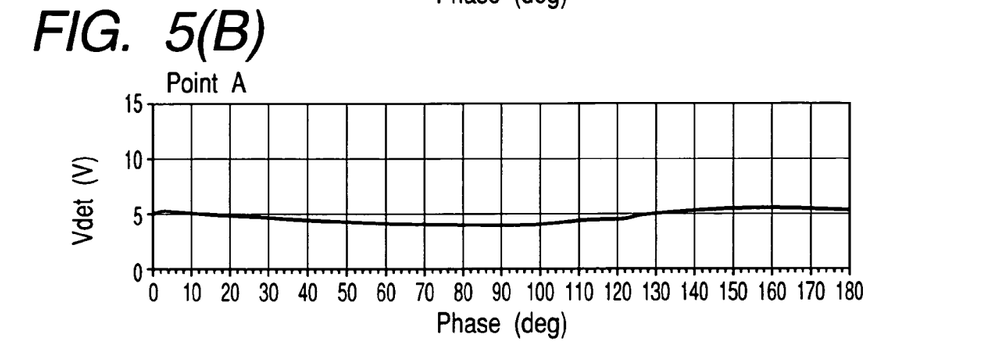
Figure 5C:
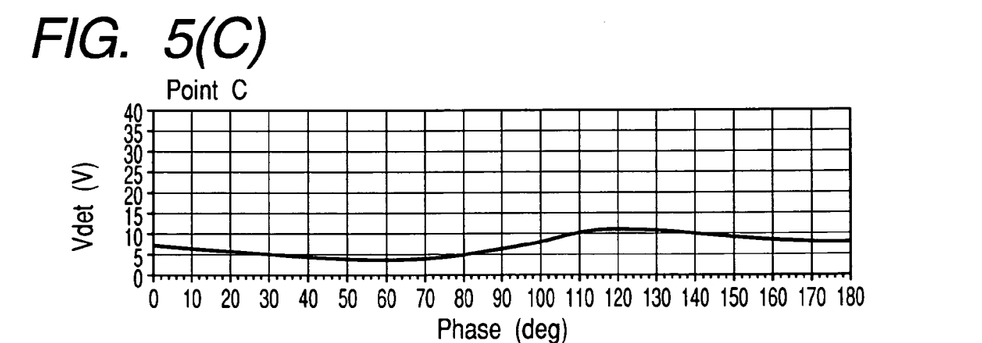
Figure 5D:
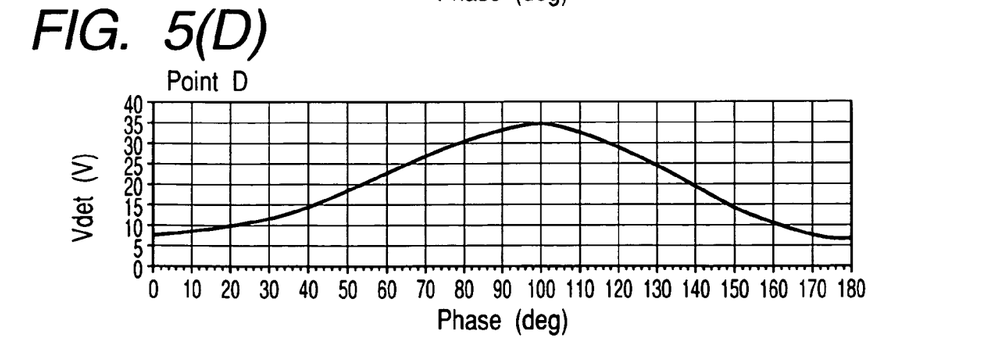

FIGS. 5A, 5B, 5C, and 5D show the result of the foregoing simulation, of which FIG. 5A shows variations in output power Pout, FIG. 5B shows a voltage Vdet detected when a monitor voltage is extracted from a point A of FIG. 3 closer to the drain terminal of the FET 213 when the output power Pout varies as shown in FIG. 5A, FIG. 5C shows a voltage Vdet detected when the monitor voltage is extracted from a point B or C of FIG. 3, and FIG. 5D shows a voltage Vdet detected when the monitor voltage is extracted from a point D of FIG. 3 closer to the output terminal OUT.

From FIGS. 5B to 5D, it will be understood that the variations in the magnitude of the detected voltage Vdet in response to load fluctuations are smaller when the monitor voltage is extracted from the point A of FIG. 3 closer to the drain terminal of the FET 213 than when the monitor voltage is extracted from the point D of FIG. 3 closer to the output terminal OUT. In terms of the variations, therefore, the extraction of the monitor voltage from the point A of FIG. 3 is preferred to the extraction of the monitor voltage from the point D of FIG. 3.

On the other hand, the shift between the phase of the detected voltage Vdet and the phase of the output power Pout is large when the monitor voltage is extracted from the point A of FIG. 3 as can be seen from FIG. 5B, while the shift between the phase of the detected voltage Vdet and the phase of the output power Pout when the monitor voltage is extracted from the point C or D of FIG. 3 is small as can be seen from FIGS. 5C and 5D. The present inventors also determined by simulation a current Icc flowing in a power amplifier by varying an input signal Pin and rotating the phase of the reflected wave such that the magnitude of the detected voltage Vdet is constant, the result of which is shown in FIG. 6.

Figure 6:
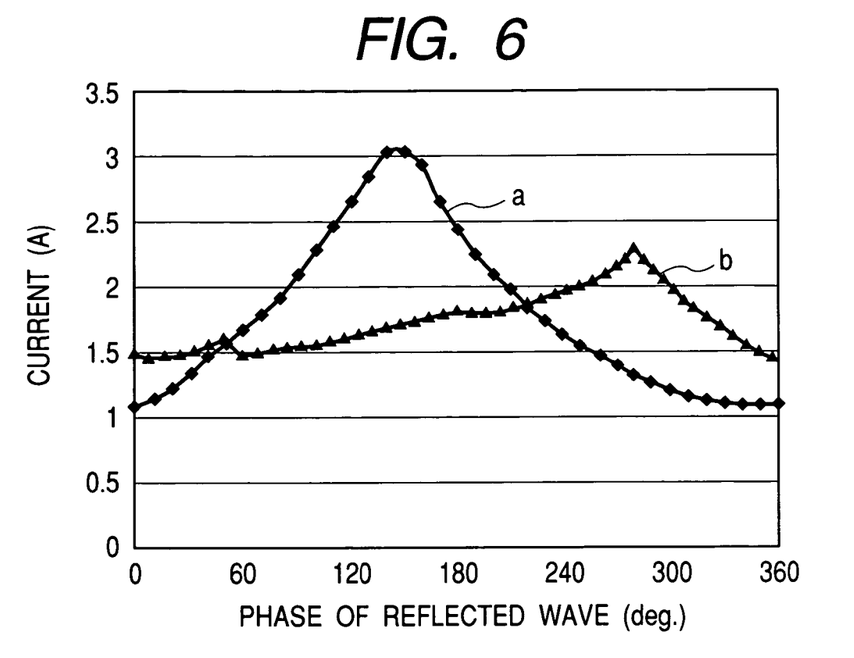
FIG. 6 is a graph showing a current in a power amplifier which varies with the phase of a reflected wave when an input signal is changed such that the magnitude of the detected voltage is constant relative to a load fluctuation.

In FIG. 6, the curve a shows variations in current Icc when the monitor voltage is extracted from the point A of FIG. 3 and the curve B shows variation in current Icc when the monitor voltage is extracted from the point C of FIG. 3. From FIG. 6, it will be understood that the current variations are smaller when the monitor voltage is extracted from the point C of FIG. 3 than when the monitor voltage is extracted from the point A of FIG. 3. Such smaller current variations indicate that current variations in response to load fluctuations are smaller, i.e., that there is less risk that the output power detection circuit 220 excessively reacts to load fluctuations in the antenna and causes an output mismatch which allows a current larger than necessary to flow in the power amplifier.

The reason for the current variations which are larger at the drain terminal of the FET 213 than at the antenna terminal is that the impedance at the drain terminal of the FET 213 is 1 to 5Ω and much smaller than 50Ω, which is the impedance at the antenna terminal, and that power variations are likely to appear as voltage variations at the antenna terminal, while power variations are likely to appear as current variations at the drain terminal of the FET 213.

Based on the result of the foregoing examination, the present embodiment has extracted the monitor voltage from the point C of FIG. 3. The following is a postulated reason for variations in the detected voltage Vdet which are larger when the monitor voltage is extracted from the point D of FIG. 3 than when the monitor voltage is extracted from the point A of FIG. 3.

Figure 7:
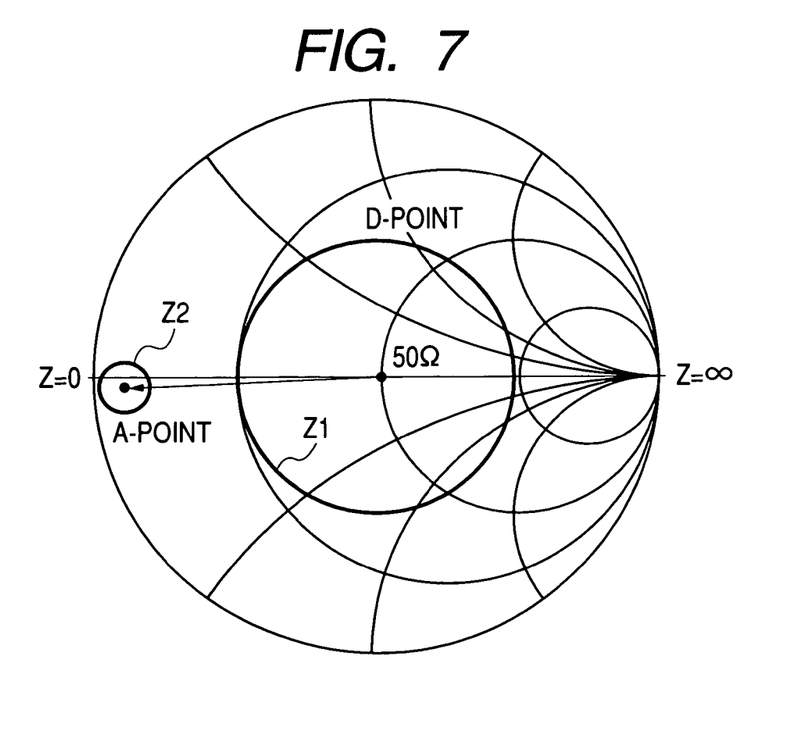
FIG. 7 is a Smith chart showing the characteristics of the impedance matching circuit, which is for illustrating the reason why a change in detected voltage is larger when the port for extracting the monitor voltage is located closer to an output terminal.

In the circuit of FIG. 3, the impedance at the point D is 50Ω when a load connected to the output terminal OUT is 50Ω and the impedance at the point A as the drain terminal of the FET 213 is converted to about 2Ω by the matching circuit 244, as indicated by the arrow X on the Smith chart shown in FIG. 7. When the impedance of the load connected to the output terminal OUT changes along a circumference centering around the point of 50Ω, as indicated by the sign Z1 in FIG. 7, the impedance at the point D naturally changes in the same manner along the circumference Z1. At this time, the impedance at the point A changes along the circumference Z2 centering around the impedance (2Ω) at the point A when the load is 50Ω. If a comparison is made between the points A and D, the point A is at a lower impedance so that it changes along the circumference Z2 with a smaller radius. Accordingly, the voltage variations in response to the load fluctuations are larger at the point D than at the point A.

Figure 8:
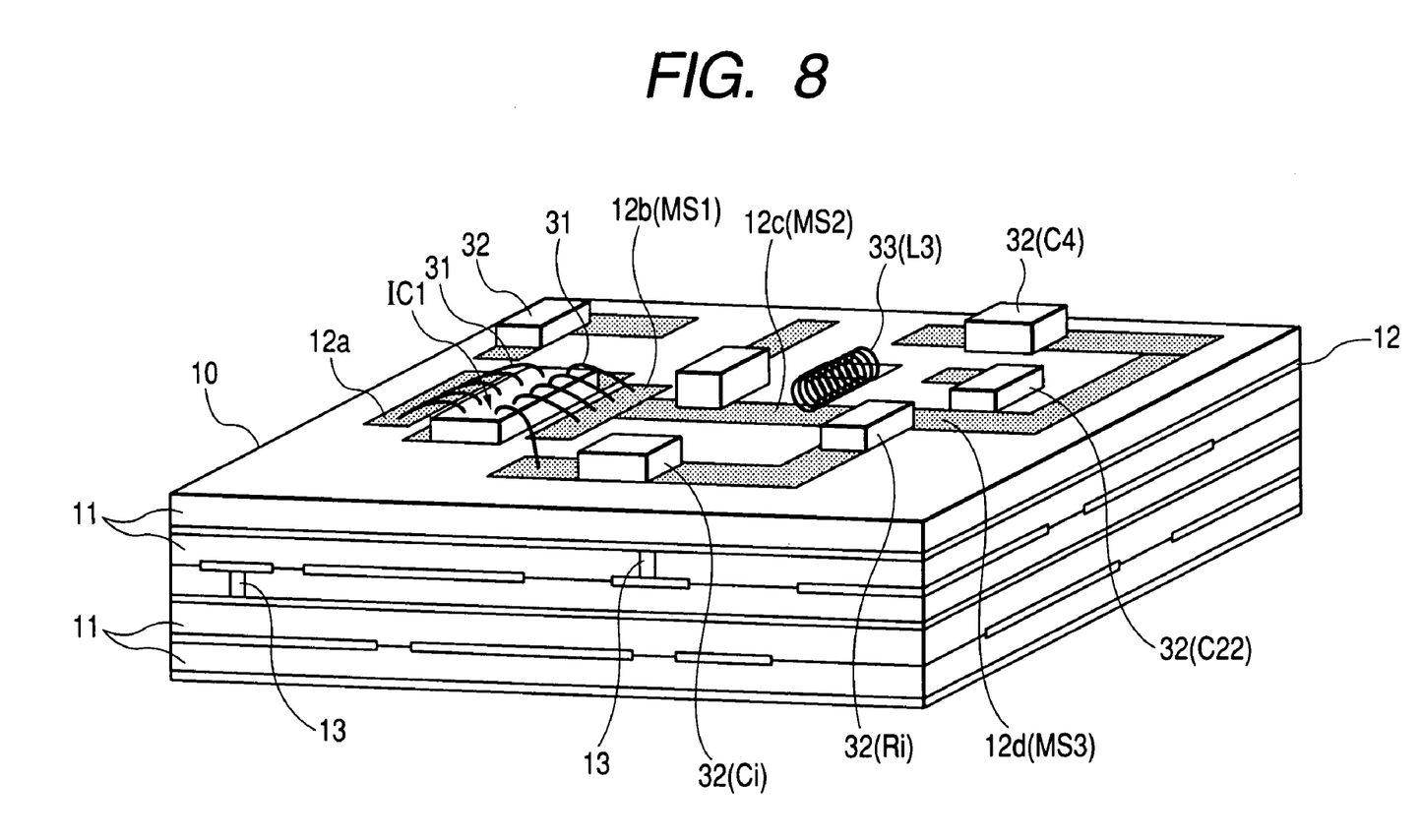
FIG. 8 is a partly cross-sectional perspective view showing the device structure of the power module according to the embodiment.

FIG. 8 shows a device structure of the power module 200 according to the embodiment. It is to be noted that FIG. 8 is not a precise representation of the structure of the RF power module according to the embodiment but a structural view for showing a schematic structure thereof with the omission of some of components and wires.

As shown in FIG. 8, the main body 10 of the module according to the present embodiment has an integrated structure obtained by laminating a plurality of dielectric layers 11 composed of ceramic plates such as alumina. A conductor layer 12 composed of a conductor such as copper formed into a specified pattern and having a surface plated with gold is provided on the top or back surface of each of the dielectric layers 11. Reference numerals 12a to 12d denote wiring patterns each composed of the conductor layer 12. To provide connection between the individual conductor layers 12 on the top or bottom surfaces of the respective dielectric layers 11 or between the individual wiring patterns, holes 13 termed through holes are provided in the respective dielectric layers 11 and a conductor is filled in each of the holes.

In the module according to the embodiment of FIG. 8, five dielectric layers 11 are laminated and the conductor layers 12 are formed over substantially the entire back surfaces of the first, third, and fifth layers from the top to serve as ground layers each for supplying a ground potential GND. The conductor layers 12 on the top or bottom surfaces of the other layers 11 are used to compose a transmission line and the like. By properly setting the widths of the conductor layers 12 and the thicknesses of the dielectric layers 11, the transmission line is formed to have an impedance of 50Ω.

The semiconductor chip IC1 mentioned above is mounted on the first dielectric layer 11 and an electrode on the upper surface of the semiconductor chip IC1 and the specified conductor layers (12a, 12b) on the surfaces of the dielectric layers 11 are electrically connected by bonding wires 31. In addition, the conductive patterns 12b, 12c, and 12d composing the microstrip lines MS1, MS2, MS3, and the like constituting the matching circuit shown in FIG. 3 are formed on the surface of the first dielectric layer 11, while discrete components 32 used as the resistor element Ri and the capacitor element Ci for extracting the monitor voltage from the matching circuit to the output power detection circuit, a component 33 used as the inductance element L3, and the like are also mounted thereon.

FIG. 8 shows the state in which the resistor element Ri for extracting the monitor voltage to the output power detection circuit in the semiconductor chip IC1 is connected to the conductor layer 12d composing the microstrip line MS3 to which the inductance element L3 is connected in FIG. 3. In short, the connection is provided such that the monitor voltage is extracted from the terminal denoted by the sign C of FIG. 3. Of the foregoing elements, the capacitor element can also be formed within the substrate by using the conductor layers on the top or bottom surfaces of the dielectric layers 11 without using the discrete component.

Figure 9:
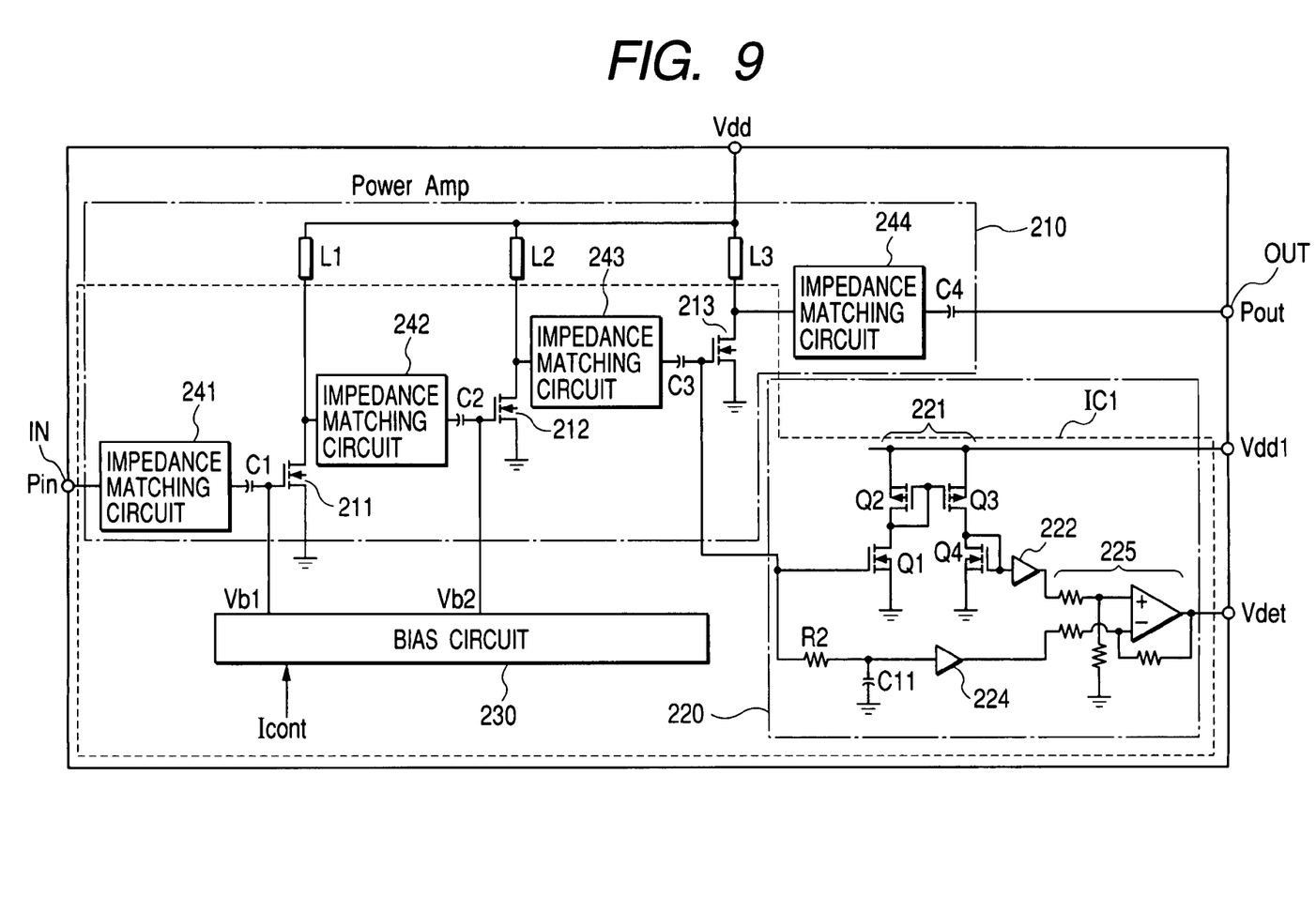
FIG. 9 is a circuit structural view showing an embodiment of a power module having an output power detection circuit in a second detection mode in a wireless communication system to which the present invention is applied.

FIG. 9 shows an embodiment of a high frequency power amplification circuit (power module) using an output power detection circuit in a second detection mode in a wireless communication system to which the present invention is applied. The power module according to the embodiment is adapted to detect an output power by detecting a current flowing in the final-stage FET 213. To detect the current flowing in the final-stage FET 213, a MOS transistor Q1 for detection having a gate terminal to which the same signal as inputted to the gate terminal of the final-stage FET 213 is inputted is provided in the present embodiment.

The MOS transistor Q1 for detection is composed of a transistor smaller in element size than the power amplifier FET 213 to allow a current obtained by proportionally reducing the drain current in the FET 213 to flow to the MOS transistor Q1. The output power detection circuit 220 according to the embodiment is provided with the current mirror circuit 221, the buffer circuit 222, and the subtraction circuit 225 which are the same as used in the first embodiment. The size ratio between the transistors Q2 and Q3 composing the current mirror circuit 221 is approximately 1:1.

The output power detection circuit 220 according to the present embodiment is different from the output power detection circuit 220 according to the first embodiment in that the signal inputted to the gate terminal of the MOS transistor Q1 for detection is inputted to the buffer circuit 224 through a lowpass filter composed of the resistor R2 and the capacitor C11 and that a voltage obtained by subtracting the dc component of the detected input, which is the output of the buffer circuit 224, from the detected voltage, which is the output of the buffer circuit 222, is outputted from the subtraction circuit 225.

As a control mode which detects an output power, compares the detected output power with a requested output level by using a circuit termed an APC circuit (see FIG. 10), and feedbacks the output power in a wireless communication system, there can be considered a variable-input fixed-bias mode which supplies a control voltage generated by the APC circuit to a variable gain amplifier provided in a stage previous to the high frequency power amplification circuit to change the gain thereof and thereby changes the amplitude of the input high frequency signal Pin in addition to a fixed-input variable-bias mode which supplies the control voltage from the APC circuit to the bias circuit 230 of FIG. 1 to control the gate bias voltage for each of the FETs 211 to 213 and thereby controls the output power.

In the wireless communication system in the variable-input fixed-bias mode, the bias voltage is fixed so that the gate bias voltage of the final-stage FET 213 of the power amplifier portion becomes relatively large when the requested output level is low, while the dc component of the signal inputted to the gate terminal of the MOS transistor Q1 for detection becomes relatively large, which may lower the detection sensitivity. However, the detection sensitivity can be enhanced by thus constructing the wireless communication system such that the voltage obtained by subtracting the dc component of the detected input from the detected voltage is outputted as an output detected voltage Vdet from the subtraction circuit 225. It can therefore be said that the output power detection circuit 220 according to the present embodiment is particularly effective in the wireless communication system in the variable-input fixed-bias mode.

Figure 10:
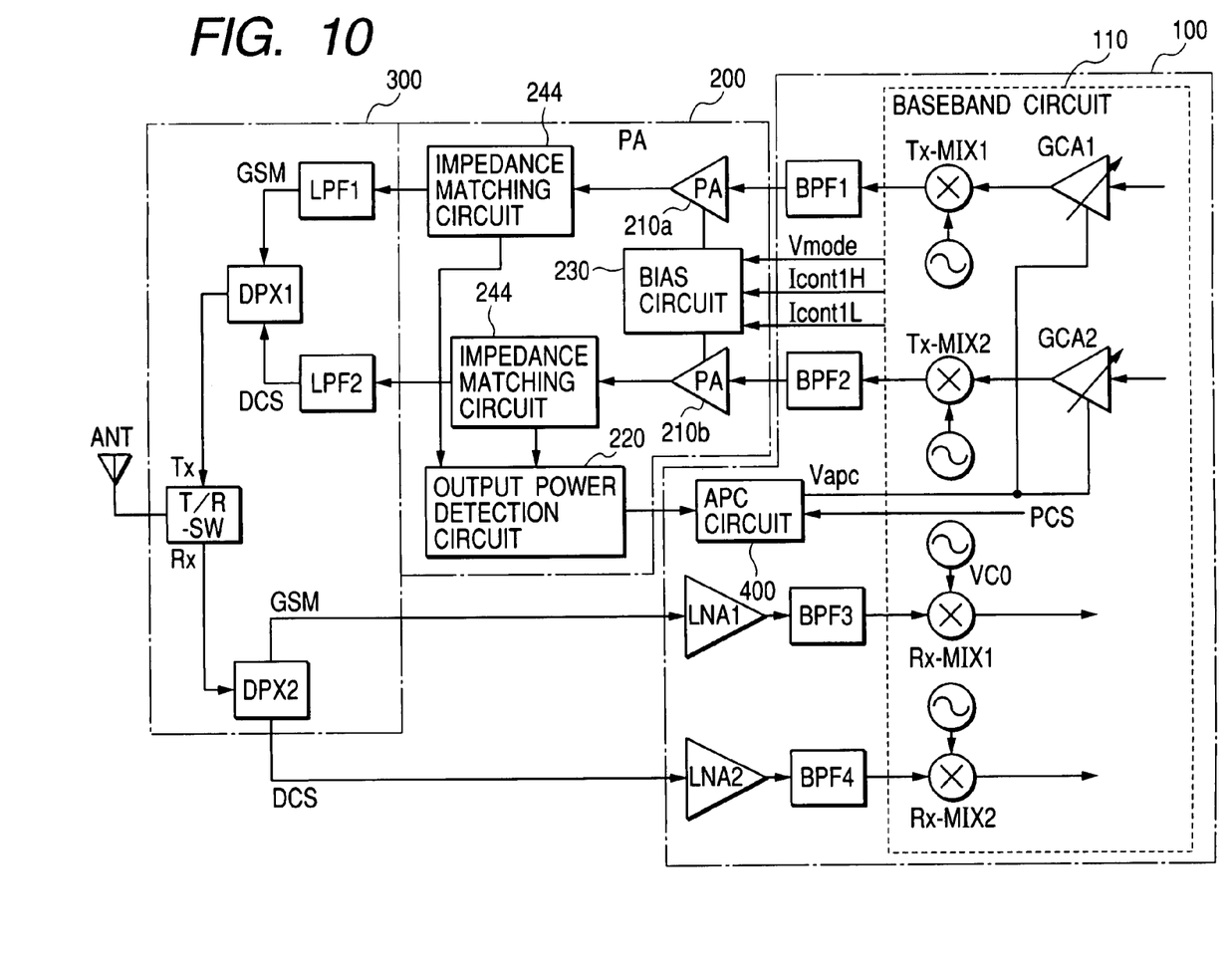
FIG. 10 is a block diagram showing a schematic structure of a system capable of wireless communication in the two communication modes of GSM and DCS to which the present invention is applied.

As an example of the wireless communication system to which the present invention is applied effectively, FIG. 10 shows a schematic structure of a system capable of wireless communication in the two communication modes of GSM and DCS.

In FIG. 10, ANT denotes an antenna for transmitting and receiving a signal wave and 100 denotes an electronic device (hereinafter referred to as an RF device) composed of a semiconductor integrated circuit for processing high frequency signals (baseband IC), bandpass filters BPF1 and BPF2 each for removing a harmonic component from a signal to be transmitted, bandpass filters BPF3 and BPF4 each for removing an unwanted wave from a received signal, and the like, which are mounted on a single package. The baseband IC comprises: a modulation/demodulation circuit capable of performing GMSK modulation/demodulation in GSM and DCS systems; a high frequency signal processing circuit (baseband circuit) 110 having a circuit for generating signals I and Q based on data to be transmitted (baseband signal) and processing the signals I and Q extracted from the received signal; and low noise amplifiers LAN1 and LAN2 for amplifying the received signal, which are formed on a single semiconductor chip. In the baseband circuit 110, Tx-MIX1 and Tx-MIX2 are respective mixers for up-converting GSM and DCS signals to be transmitted and Rx-MIX1 and Rx-MIX2 are respective mixers for down-converting GSM and DCS received signals.

In FIG. 10, 200 denotes the power module according to the foregoing embodiment, which is for amplifying a high frequency signal supplied from the RF device 100, 300 denotes a front-end module including filters LPF1 and LPF2 for removing noise such as a harmonic contained in the signal to be transmitted, demultiplexers DPX1 and DPX2 for combining or separating GSM and DCS signals, transmission/reception switch T/R-SW, and the like, 400 denotes an automatic power control circuit (APC circuit) for generating an output control signal Vapc to gain control amplifiers GCA1 and GCA2 in the baseband circuit 110 based on the detected voltage Vdet from the output power detection circuit 220 and a power control signal PCS from the baseband circuit 110.

Although the APC circuit 400 is constructed as a semiconductor integrated circuit and mounted together with the baseband circuit 110 and the like on the substrate of the RF device 100 in the present embodiment, it may also be mounted on the substrate of a power module on which the power amplifiers (PA) 210*a* and 210*b*, the output power detection circuit 220, the bias circuit 230, and the like are mounted or on the substrate of the front-end module 300.

As shown in FIG. 10, respective bias currents Icont1H and Icont1L for the GSM power amplifier 210*a* and the DCS power amplifier 210*b* in the power module 200 are supplied from the baseband circuit 110 of the RF device 100 in this embodiment. Of the currents Icont1H and Icont1L, the current Icont1H is a current supplied in a GSM transmission mode and the current Icont1L is a current supplied in a DCS transmission mode. The respective gains of the power amplifiers 210*a* and 210*b* are determined by the currents Icont1H and Icont1L supplied from the baseband circuit 110. Of the currents Icont1H and Icont1L, either one is supplied to the power module 200 and there is no such situation in which they are supplied simultaneously.

A mode selection signal Vmode representing either the GSM or DCS mode is supplied from the baseband circuit 110 to the bias circuit 230 such that the bias circuit 230 generates, based on the control signal Vmode, the bias current in accordance with the mode and supplies the generated bias current to either of the power amplifiers 210*a* and 210*b*. The bias circuit 230 may also be constructed to determine which one of the currents Icont1H and Icont1L is supplied from the RF device 110 and perform switching in the bias circuit 210 based on the result of the determination.

As can be seen from FIG. 10, this embodiment performs a control operation which supplies the output control signal Vapc outputted from the APC circuit 400 to the gain control amplifiers GCA1 and GCA2 in the baseband circuit 110, while holding the respective gains of the power amplifiers 210*a* and 210*b* constant with the currents Icont1H and Icont1L supplied from the baseband circuit 110, and controls the respective gains of the gain control amplifiers GCA1 and GCA2 by using the output control signal Vapc such that respective input powers to the power amplifiers 210*a* and 210b are changed thereby and the respective output powers from the power amplifiers 210a and 210b change in response thereto.

The wireless communication system may also be constructed such that, instead of controlling the amplitude of a signal to be transmitted which is inputted to the power module 200 by providing the gain control amplifiers GCA1 and GCA2, the output control signal Vapc outputted from the APC circuit 400 is supplied to the bias circuit 230 of the power module 200, while the amplitude of the signal to be transmitted which is inputted from the baseband IC to the power module 200 is held constant, the bias circuit 230 variably controls the respective bias currents for the power amplifiers 210a and 210b in accordance with the output control signal Vapc, and the respective gains of the power amplifiers 210a and 210b are thereby controlled.

Although the bandpass filters BPF1 to BPF4 are composed of the capacitor elements and resistor elements provided externally of the baseband IC in this embodiment, the elements composing the bandpass filters BPF1 to BPF4 may also be formed on the same semiconductor chip as the baseband circuit 110. It is also possible to provide a microprocessor (CPU) for controlling the entire system by generating an output level indication signal as a basis for the control signal and the power control signal PCS to the RF device 100 in addition to the device and the module described above, though it is not shown in FIG. 10.

Although the specific description has been given thus far to the embodiment of the invention achieved by the present inventors, the present invention is not limited to the foregoing embodiment. It will easily be appreciated that various modifications and changes can be made without departing from the gist thereof. For example, although the capacitor C21 is connected to the node between the microstrip lines MS1 and MS2 and the inductor L3 is connected to the node between the microstrip lines MS2 and MS3 in the impedance matching circuit 244 shown in FIG. 3, a variation which switches the respective positions of the nodes connected to the inductor L3 and to the capacitor C21 may also be considered. In that case, the monitor voltage generated by the output power detection circuit 220 is extracted preferably from the terminal C (positioned between the capacitors C21 and C22) rather than the terminal B. Although the power amplifier FETs are connected in three stages in the high frequency power amplification circuit according to the foregoing embodiment, they may also be connected in two stages or four or more stages.

Although the description has been given thus far to the case where the present invention is applied to the power module composing the dual-mode wireless communication system capable of transmission and reception in the two communication modes of GSM and DCS, which is a field of use as a background for the invention, the present invention is not limited thereto and can be used for a power module composing a wireless communication system such as a multi-mode portable or mobile phone capable of transmission and reception in another communication mode or in three or more communication modes including GMS, DCS, and PCS (Personal Communication System).

The following is a brief description of effects achievable by the representative aspects of the present invention disclosed in the present application.

That is, the present invention allows the implementation of an electronic component for high frequency power amplification provided with a high-sensitivity output power detection circuit which is immune to the influence of changes in the use environment thereof, free of an output mismatch, small in size, and low in insertion loss and a wireless communication system using the electronic component.

What is claimed is:

1. An electronic component for high frequency power amplification, said electronic component comprising:
   a power amplification circuit which is coupled between an input terminal and an output terminal and which amplifies a modulated high frequency signal;
   an output power detection circuit which detects a magnitude of an output power of the power amplification circuit and outputting a signal for enabling feedback control of the output power of said power amplification circuit; and
   an impedance matching circuit coupled between an output of the power amplification circuit and the output terminal, wherein said impedance matching circuit comprises:
   a microstrip line comprised of a conductor layer having one end connected to an output terminal of a final-stage amplifier element of said power amplification circuit, and
   first and second capacitor elements connected between respective portions of the microstrip line and power source potential points, and
   wherein a monitor voltage extraction point is provided between the portion connected to said first capacitor element and the portion connected to said second capacitor element, of said microstrip line; and
   wherein said output power detection circuit receives a monitor voltage from the impedance matching circuit via a capacitor element coupled between the impedance matching circuit and the output power detection circuit so that the output power detection circuit detects the output power of the power amplification circuit.

2. The electronic component for high frequency power amplification according to claim 1, further comprising:
   a resistor element connected in series to said capacitor element between said capacitor element and the monitor voltage extraction point in the impedance matching circuit.

3. The electronic component for high frequency power amplification according to claim 1,
   wherein said output power detection circuit comprises:
   a first transistor having a control terminal to which the monitor voltage supplied via said capacitor element is applied;
   a second transistor connected in series to the first transistor;
   a third transistor current mirror connected to the second transistor;
   a current-to-voltage conversion transistor connected in series to the third transistor;
   a bias generation circuit for supplying an operating point to the control terminal of said first transistor; and
   a subtraction circuit for outputting, as a detected signal, a voltage in accordance with a difference between a voltage converted by said current-to-voltage conversion transistor and a voltage supplied to said first transistor by said bias generation circuit.

4. The electronic component for high frequency power amplification according to claim 3, further comprising:
   a bias circuit which is coupled to said power amplification circuit supplying a bias to said power amplification circuit.

5. The electronic component for high frequency power amplification according to claim 4,
wherein said bias generation circuit provides a bias voltage to said first transistor to perform a class-B amplifying operation.

6. The electronic component for high frequency power amplification according to claim 1,
wherein said power amplification circuit and said output power detection circuit are formed over a single semiconductor chip.

7. An electronic component for high frequency power amplification, said electronic component comprising:
a power amplification circuit for amplifying a modulated high frequency signal;
a current detection circuit which receives an output signal from a matching circuit to be amplified by the power amplification circuit and detects a current in the power amplification circuit;
current-to-voltage conversion means for converting the current detected by the current detection circuit to a voltage; and
a control circuit outputting a detection signal for enabling feedback control of an output power of said power amplification circuit responsive to said voltage, and
wherein said current detection circuit includes:
a first transistor for receiving the input signal to said power amplification circuit at a control terminal thereof;
a second transistor connected in series to the first transistor; and
a third transistor current mirror connected to said second transistor, and wherein said current-to-voltage conversion means has a fourth transistor connected in series to said third transistor.

8. The electronic component for high frequency power amplification according to claim 7, wherein said current detection circuit further includes:
a lowpass filter for extracting a dc component of said output signal; and
wherein said control circuit outputs a signal, as the detection signal, in accordance with a difference between the voltage converted by said current-to-voltage conversion means and the dc component of said output signal extracted by said lowpass filter.

9. The electronic component for high frequency power amplification according to claim 7, further comprising:
a bias circuit which is coupled to the power amplification circuit for supplying a bias to said power amplification circuit.

10. A wireless communication system, comprising:
a first electronic component comprising:
a power amplification circuit for amplifying a modulated high frequency signal; and
an output power detection circuit for detecting a magnitude of an output power of the power amplification circuit and outputting a detection signal for enabling feedback control of the output power of said power amplification circuit,
wherein said output power detection circuit receives a monitor voltage from an impedance matching circuit provided closer to an output of said power amplification circuit via a capacitor element and detects the output power of the power amplification circuit;
a second electronic component including a transmission/reception switching circuit for performing switching between a signal to be transmitted and a received signal; and
a third electronic component for modulating the signal to be transmitted and inputting the modulated signal to said first electronic component,
wherein said third electronic component includes:
a gain control amplification circuit capable of controlling an amplitude of the signal to be transmitted which is supplied to said first electronic component; and
an output level control circuit for comparing the detection signal with an output level indication signal and supplying a control signal to said gain control amplification circuit to change a gain.

11. The wireless communication system according to claim 10, wherein said first electronic component includes:
a first power amplification circuit for amplifying a first signal in a first frequency band; and
a second power amplification circuit for amplifying a second signal in a second frequency band,
wherein said second electronic component has signal switching means for performing switching between the first signal in the first frequency band and the second signal in the second frequency band, and wherein said third electronic component has a first circuit for modulating the first signal in the first frequency band and a second circuit for modulating the second signal in the second frequency band, and said output power detection circuit is provided as a common circuit for said first and second power amplification circuits.

12. A wireless communication system, comprising:
a first electronic component comprising:
a power amplification circuit for amplifying a modulated high frequency signal; and
an output power detection circuit for detecting a magnitude of an output power of the power amplification circuit and outputting a detection signal for enabling feedback control of the output power of said power amplification circuit,
wherein said output power detection circuit receives a monitor voltage from an impedance matching circuit provided closer to an output of said power amplification circuit via a capacitor element and detects the output power of the power amplification circuit, including a bias circuit for supplying a bias to said power amplification circuit;
a second electronic component including a transmission/reception switching circuit for performing switching between a signal to be transmitted and a received signal;
a third electronic component for modulating the signal to be transmitted and inputting the modulated signal to said first electronic component; and
an output level control circuit for comparing the detection signal with an output level indication signal and supplying a control signal to said bias circuit to change a bias given to said power amplification circuit.

* * * * *